United States Patent
Roine et al.

(10) Patent No.: US 9,300,247 B2
(45) Date of Patent: Mar. 29, 2016

(54) RC OSCILLATOR WITH ADDITIONAL INVERTER IN SERIES WITH CAPACITOR

(71) Applicant: TEXAS INSTRUMENTS INCORPORATED, Dallas, TX (US)

(72) Inventors: Per Torstein Roine, Oslo (NO); Danielle L Griffith, Richardson, TX (US); Ryan A Smith, Sanchse, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 49 days.

(21) Appl. No.: 13/887,434

(22) Filed: May 6, 2013

(65) Prior Publication Data

US 2014/0327486 A1   Nov. 6, 2014

(51) Int. Cl.
*H03L 7/099* (2006.01)
*H03B 5/24* (2006.01)
*H03K 3/03* (2006.01)
*H03K 3/354* (2006.01)

(52) U.S. Cl.
CPC .............. *H03B 5/24* (2013.01); *H03K 3/0315* (2013.01); *H03K 3/03* (2013.01); *H03K 3/354* (2013.01); *H03L 7/099* (2013.01)

(58) Field of Classification Search
CPC .............. H03K 3/0315; H03K 3/354; H03K 2005/013; H03K 3/03; H03L 7/099; H03B 5/24
USPC ........... 331/57, 111, 137, 140, 143, 185, 186, 331/108 C; 327/182
See application file for complete search history.

(56) References Cited

U.S. PATENT DOCUMENTS

| | | | | |
|---|---|---|---|---|
| 4,316,158 | A * | 2/1982 | Akita et al. | 331/111 |
| 5,197,033 | A * | 3/1993 | Watanabe et al. | 365/226 |
| 5,434,534 | A * | 7/1995 | Lucas | 327/546 |
| 6,462,625 | B2 * | 10/2002 | Kim | 331/57 |
| 6,496,056 | B1 * | 12/2002 | Shoji | 327/543 |
| 6,943,638 | B1 * | 9/2005 | Li | 331/144 |
| 2012/0313665 | A1 * | 12/2012 | Ochoa | 326/104 |
| 2013/0176082 | A1 * | 7/2013 | Ishikawa | 331/36 C |

* cited by examiner

Primary Examiner — Richard Tan
(74) Attorney, Agent, or Firm — Lawrence J. Bassuk; Frank D. Cimino (57) ABSTRACT

In an electronic device, an RC oscillator generally includes a resistor, a capacitor and at least one inverter. The resistor and capacitor generate a time-varying voltage. The time-varying voltage is provided to the at least one inverter to cause a clock signal to propagate therethrough. The clock signal propagates with a time delay that is at least partially dependent on a supply voltage. The supply voltage is adjusted to maintain the time delay at almost a constant value.

6 Claims, 5 Drawing Sheets

| EXAMPLE | FREQUENCY (MHz) | AREA (m m^2) | CURRENT (uA) | ACCURACY (+/-,3 SIGMA) | MHz/mA | MHz/mA/ AREA | MHz/mA/AREA/ ACCURACY (FOM) |
|---|---|---|---|---|---|---|---|
| PRIOR ART EXAMPLE 1 | 12 | 0.19 | 133 | 2.5% | 90 | 475 | 2E+04 |
| PRIOR ART EXAMPLE 2 | 14 | 0.04 | 24 | 1.0% | 583 | 14,583 | 1E+06 |
| EXAMPLE A | 48 | 0.01 | 125 | 0.9% | 384 | 38,400 | 4E+06 |
| EXAMPLE B | 0.032 | 0.015 | 0.2 | 0.9% | 160 | 10,667 | 1E+06 |

RC OSCILLATOR WITH ADDITIONAL INVERTER IN SERIES WITH CAPACITOR

BACKGROUND OF THE DISCLOSURE

Many types of electronic circuits require a clock signal to operate properly. In many cases, therefore, an integrated circuit (IC) chip includes an oscillator circuit to generate the required clock signal. Some of the common types of oscillator circuits include crystal oscillators, LC (inductor-capacitor) oscillators, RC (resistor-capacitor) oscillators and ring oscillators. Within each type, there are many variations and combinations. However, some advantages and disadvantages or tradeoffs generally apply to the different types.

Crystal oscillators, for example, generally have a very stable frequency, with frequency variations below 100 ppm. However, crystal oscillators require a crystal that is external to the IC chip. The crystal can take up significant board space and add to the cost of the overall electronic device. Additionally, crystal oscillators can have a slow startup time, due to a high Q. (The Q of a crystal oscillator is an indicator of how stable or how wide or narrow band is the frequency response of the crystal oscillator. A crystal oscillator with a high Q, for example, has a very narrow band, so the frequency is very stable.)

LC oscillators generally require a relatively large area for an inductor within the IC chip. Additionally, LC oscillators are generally appropriate for use only in relatively high frequency situations in which a relatively high current (e.g. greater than 100 uA) is available.

RC oscillators and ring oscillators generally require a relatively low area within the IC chip and may be operated with relatively low power levels. However, both types generally suffer from a relatively large frequency variation that depends on variations in manufacturing processes, supply voltage and operating temperature.

It is with respect to these and other background considerations that the present disclosure has evolved.

SUMMARY OF THE DISCLOSURE

In some embodiments, the present disclosure involves an electronic device with an RC oscillator that provides an oscillating clock signal to a clocked circuitry, the RC oscillator having a resistor, a capacitor and at least one signal propagating inverter. The resistor and the capacitor are connected together to generate a time-varying voltage. The time-varying voltage is provided to the at least one signal propagating inverter to cause the oscillating clock signal to propagate therethrough. The oscillating clock signal propagates in accordance with a time delay. The time delay is at least partially dependent on a supply voltage. The supply voltage is adjusted to maintain the time delay at almost a constant value.

In some embodiments, the present disclosure involves a method that includes generating a time-varying voltage by an RC circuit; generating a clock signal in response to the time-varying voltage and subject to a time delay; and maintaining the time delay almost constant by adjusting a supply voltage. In more specific embodiments, the clock signal is generated by providing the time-varying voltage to a first one of a series of inverters and propagating the clock signal through the inverters. Additionally, the supply voltage may be adjusted using a self-biased inverter having a design similar to that of each inverter in the series of inverters, so that the sensitivity of the self-biased inverter to variations in manufacturing processes, supply voltage and operating temperature will be the same as that of each inverter in the series of inverters.

A more complete appreciation of the present disclosure and its scope, and the manner in which it achieves the improvements described herein, can be obtained by reference to the following detailed description of presently preferred embodiments taken in connection with the accompanying drawings, which are briefly summarized below, and the appended claims.

DETAILED DESCRIPTION OF THE DISCLOSURE

Figure 1:
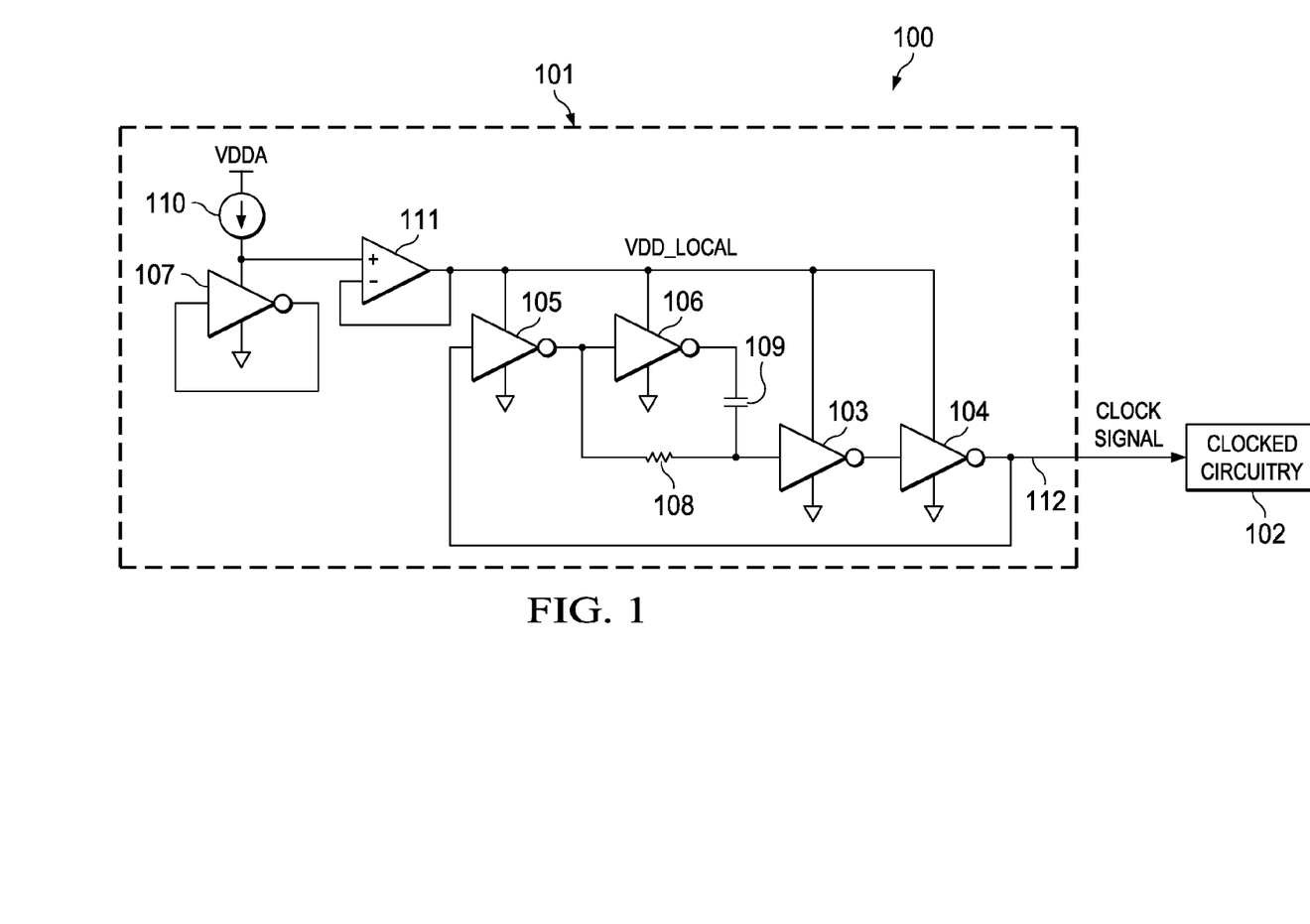
FIG. 1 is a simplified schematic diagram of an example electronic circuit with an RC oscillator incorporating an embodiment of the present disclosure.

An electronic circuit 100 is shown in FIG. 1 in accordance with an embodiment of the present disclosure. The electronic circuit 100 uses a clock signal with a relatively high-stability frequency generated by an RC oscillator 101. In addition to the relatively high-stability frequency, the RC oscillator 101 allows for a relatively small area within an IC chip, relatively low jitter, relatively low power consumption and no components necessarily external to the IC chip.

The electronic circuit 100 may represent either an entire electronic device or an IC chip. Therefore, in addition to the RC oscillator 101, the electronic circuit 100 includes clocked circuitry 102 that uses the clock signal. The clocked circuitry 102 represents any appropriate digital and/or analog circuits that may be included within the same electronic device or IC chip as the RC oscillator 101.

According to the illustrated embodiment, the RC oscillator 101 generally includes inverters 103-107, a resistor 108, a capacitor 109, a current source 110 and a buffer 111. It is understood that additional components may also be included in the RC oscillator 101, but are not shown for simplicity.

The inverters 103, 104 and 105 generally form an inversion loop, ring or series of inverters through which the clock signal propagates and is produced at node 112. Though only three inverters 103-105 are shown, it is understood that any appropriate number (preferably an odd number) of inverters may be used to form the inversion ring or series of inverters. Additionally, although the output clock signal is shown being produced by the second inverter 104, it is understood that the clock signal may be produced at any appropriate point within the inversion ring or series of inverters.

The resistor 108 and the capacitor 109 generally form an RC circuit that initiates each cycle and controls the period/frequency of the clock signal. The resistor 108 and capacitor 109 are connected to the input of the first inverter 103. The other electrode of the resistor 108 is connected to the output of the third inverter 105 (or last inverter of the ring or series). The other electrode of the capacitor 109, on the other hand, is connected to the output of the inverter 106.

The inverter 106 is generally not considered to be a part of the inversion ring or series of inverters, even though its input is connected to the output of the third (or last) inverter 105 in the ring. Instead, the inverter 106 produces an out-of-phase signal needed to cause the RC circuit of the resistor 108 and the capacitor 109 to generate a time-varying voltage at the input of the first inverter 103.

The supply voltage provided to each of the inverters 103-106 is labeled as Vdd_local. As a result of the configuration shown and described, the voltage range over which the capacitor 109 is charged is about twice the value of the supply voltage Vdd_local, which is also about twice the voltage range for a capacitor in a roughly comparable prior art RC oscillator. As a result, the required physical size of the capacitor 109 may be about half that of the capacitor in a roughly comparable prior art RC oscillator for about the same performance. Additionally, operation of the RC oscillator 101 in this configuration does not result in the capacitor 109 discharging as completely as the capacitor does in a roughly comparable prior art RC oscillator. Consequently, the current consumption by the RC oscillator 101 due to the charging and discharging of the capacitor 109 is less than that for a roughly comparable prior art RC oscillator with about the same performance or frequency.

The current source 110, the inverter 107 and the buffer 111 represent a simplified example circuit for generating the desired supply voltage Vdd_local. In this example, the level of the supply voltage Vdd_local is controlled by the inverter 107 and the buffer 111 under the power of the (relatively constant) current source 110 from an appropriate available supply voltage labeled as Vdda. The inverter 107 is self-biased (i.e. its output is connected to its input), and the supply voltage Vdd_local is connected to the supply voltage input of the inverter 107 through the buffer 111. In this configuration, therefore, the supply voltage Vdd_local is generally about the same as or based upon or relative to the threshold voltages (Vtn or Vtp) of the transistors (NMOS or PMOS) that form the self-biased inverter 107. Example circuits for implementing variations of the self-biased inverter 107 and the buffer 111 are shown in FIGS. 4-9 as described below. It is understood, however, that the present disclosure is not limited to these implementations.

Additionally, the voltage level of the supply voltage Vdd_local can be adjusted by changing the level of the current from the current source 110. However, there is generally a tradeoff between the level of the current or power provided to the self-biased inverter 107 (and the other inverters 103-106) and the accuracy or variation of the frequency produced by the RC oscillator 101. In other words, a lower frequency variation can generally be achieved at the cost of a higher current level.

The self-biased inverter 107 generally has the same or similar design as that of the other inverters 103-106 and is fabricated according to the same or similar processes as are the inverters 103-106. Therefore, variations in fabrication processes, applied voltages and operating temperatures, among potentially other transistor characteristics or parameters, generally have the same or similar effects on the self-biased inverter 107 as on the other inverters 103-106. The level of the supply voltage Vdd_local, therefore, generally varies by tracking the behavior of the self-biased inverter 107 (primarily with regard to the threshold voltages of the transistors in the self-biased inverter 107), which is about the same as the behavior of the other inverters 103-106. As a result, variations in the transistor characteristics or parameters of the inverters 103-106 are substantially cancelled out by variations in the supply voltage Vdd_local. In other words, the operation of the inverters 103-106 is substantially constant over a wide range of operating conditions.

Each of the inverters 103-105 in the inversion ring has an inherent time delay in the propagation of the clock signal. The overall time delay for propagating the clock signal through the inverters 103-105 may limit the maximum frequency that the RC oscillator 101 is capable of, i.e. at higher frequencies the time delay may represent a significant portion of each clock period. It is generally preferable, however, for the frequency to be determined by the resistor 108 and the capacitor 109, rather than by the inverters 103-105, in order to maintain accurate control over the frequency. Additionally, the time delay should ideally be so small relative to the time constant of the RC circuit (108 and 109) that any variations in the time delay would have a negligible affect on the clock signal.

Since the time delay cannot realistically be made so small as to be completely negligible, it is beneficial to make the variation in the time delay so small that the time delay is almost or substantially constant. The above described method of varying the supply voltage Vdd_local to track changes in the threshold voltage of the transistor in the self-biased inverter 107 results in maintaining the time delay almost or substantially constant within the inverters 103-105 of the inversion ring. In other words, for example, when the temperature of the electronic circuit 100 changes during operation, the supply voltage Vdd_local is automatically adjusted to maintain the time delay almost constant. In this manner, the frequency of the output clock signal is highly stable. Therefore, since variations in the operation of the inverters 103-106 are substantially cancelled out, the frequency stability of the clock signal is generally determined primarily by the characteristics of only the resistor 108 and the capacitor 109.

Figure 2:
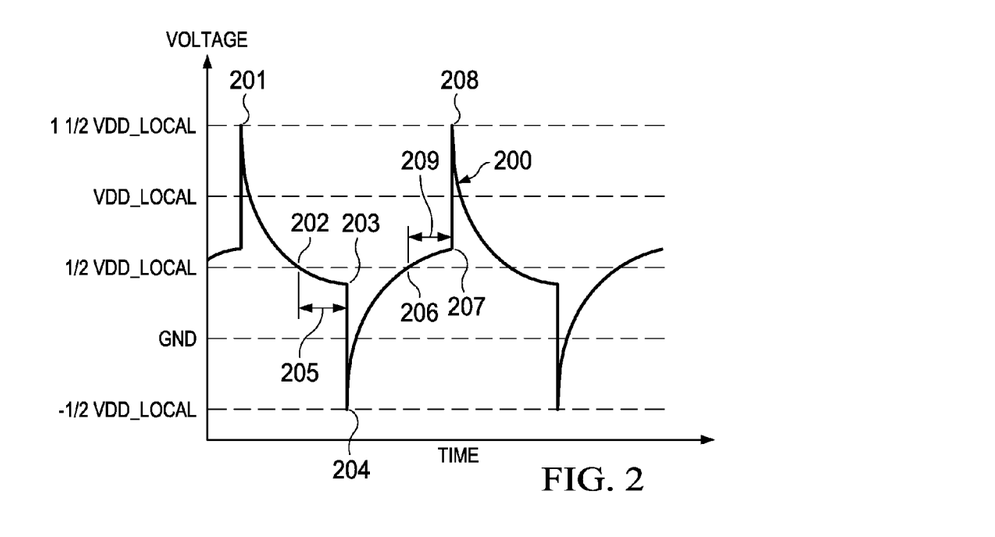
FIG. 2 is a simplified graph of voltage vs. time at a node within the RC oscillator shown in FIG. 1 in accordance with an embodiment of the present disclosure.

An example graph 200 of the time-varying voltage generated by the resistor 108 and capacitor 109 at the input of the first inverter 103 of the inversion ring is shown in FIG. 2 in accordance with an embodiment of the present disclosure. This graph 200 is generated by simulation, is not necessarily drawn to scale, and may have some features that are exaggerated or understated for ease of illustration and explanation. In this example, the voltage swing of the graph 200 is about twice the value of the supply voltage Vdd_local, between about −½ Vdd_local and about 1½ Vdd_local. The trip or switching voltage level for the first inverter 103 is about ½ Vdd_local, about halfway between the upper and lower limits of the voltage swing.

The time-varying voltage (graph 200) initiates each state change (i.e. high to low and low to high) for each cycle of the clock signal at the input of the first inverter 103. Each state change then propagates through the inversion ring (103-105) to trigger the RC circuit (108 and 109) to initiate the next state change. For example, a cycle of the time-varying voltage (graph 200) of the RC circuit (108 and 109) may be considered to begin at point 201 in the graph 200. At this point 201 in this example, a state change at the output of the third or last inverter 105 has caused a rapid increase or spike in the time-varying voltage (graph 200) to its upper limit at about 1½ Vdd_local from a previous point that was already above the trip voltage level of the first inverter 103.

The time constant of the RC circuit (108 and 109) causes the time-varying voltage (graph 200) to decay from the point 201 generally as shown. When the time-varying voltage decays to the trip voltage level of the first inverter 103 at about point 202, the first inverter 103 changes its output state. The time-varying voltage continues to decay after point 202 while the state change propagates through the inverters 103-105. At point 203, the state change has propagated to the output of the third or last inverter 105, which causes another rapid spike in the time-varying voltage to its lower limit at about −½ Vdd_local at point 204. Thus, a time duration 205 (from point 202 to point 203) represents the substantially constant propagation time delay through the inversion ring (103-105). The RC oscillator 101 can generally be made more accurate by reducing the time duration 205, i.e. increasing the speed of the inverters 103-105.

Again, the time constant of the RC circuit (108 and 109) causes the time-varying voltage (graph 200) to decay from the point 204 generally as shown. When the time-varying voltage decays to the trip voltage level of the first inverter 103 at about point 206, the first inverter 103 changes its output state again with similar advantages as those described above for the state change of the first inverter 103 at point 202. The time-varying voltage continues to decay after point 206 while the state change propagates through the inverters 103-105. At point 207, the state change has propagated to the output of the third or last inverter 105, which causes a rapid spike in the time-varying voltage back to its upper limit at about 1½ Vdd_local at point 208. Thus, another time duration 209 (from point 206 to point 207, similar to the time duration 205) represents the propagation time delay through the inversion ring (103-105) for the second state change. The cycle repeats from point 208 as from point 201.

At the state change initiation points 202 and 206, the characteristic short circuit current in the transistor that forms the first inverter 103 enables the inverter 103 to serve as a comparator without significantly increasing the power consumption of the RC oscillator 101. Since the inverter 103 is generally biased at close to twice its threshold voltage Vt, there is very little short circuit current, even when the time-varying voltage is around the midpoint (½ Vdd_local) at which the inverter 103 switches states. In this manner, the inverter 103 makes a very good comparator with high efficiency and low power consumption with respect to its speed and accuracy. Prior art RC oscillators, on the other hand, typically use an actual comparator, requiring a constant current bias, to enable the state transitions. These prior art RC oscillators, thus, have significant current draw at all times, whereas the RC oscillator 101 has it's greatest current consumption when the inputs to the inverters 103-106 are close to the trip voltage level, about ½ Vdd_local. At other times, the current consumption (e.g. to charge and discharge the capacitor 109) is significantly reduced. Thus, the current consumption of the RC oscillator 101 is relatively low compared to prior art RC oscillators. Additionally, the amount of the current consumption can be controlled by the regulated supply voltage Vdd_local.

Figure 3:
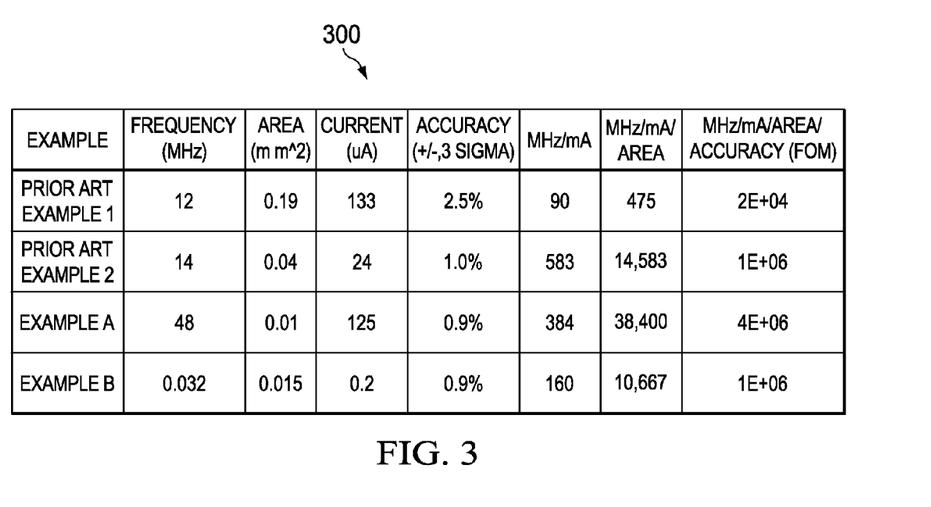
FIG. 3 is a table of example data for calculating a figure of merit (FOM) characterizing the RC oscillator shown in FIG. 1 in accordance with an embodiment of the present disclosure.

A table 300 of example data (Example A and Example B) for calculating a common figure of merit (FOM) characterizing the RC oscillator 101 (FIG. 1) in comparison with data for two example prior art oscillators (Prior Art Example 1 and Prior Art Example 2) is shown in FIG. 3. The data for the two prior art examples is taken from publicly available datasheets for two actual products. Both of these prior art examples are variations on RC oscillators. The prior art example 1 is generally an oscillator in which a current charges a capacitor, the voltage across which is compared to a voltage generated by a copy of the current as it is supplied to a resistor. The prior art example 2 is a type of RC relaxation oscillator. The data for Examples A and B is generated for an example simulated circuit for the RC oscillator 101. For a proper side-by-side comparison, the two prior art examples and the Example A for the present invention are provided for relatively similar frequencies in the megahertz range. For contrast, on the other hand, the Example B for the present invention disclosure is provided for a frequency in the kilohertz range.

Data is shown for the frequency generated by the oscillator, the area within the IC chip that the oscillator covers, the current usage by the oscillator and the percent accuracy of the oscillator. Calculated values are then provided for the frequency divided by the current, then further divided by the area and finally divided by the accuracy. The final value, frequency divided by current, area and accuracy, is the figure of merit (FOM) by which these oscillators are compared. A larger number for this value is commonly considered to be more desirable.

Although the two prior art examples and the Example A have similar frequencies (all in the megahertz range), the FOM for the Example A is four times better than that of the Prior Art Example 2 and two hundred times better than that of the Prior Art Example 1. Additionally, this improvement is achieved with a considerably smaller area for the Example A than for either prior art example.

Although there is generally a tradeoff between the level of the current or power consumed and the accuracy or variation of the frequency produced by the RC oscillator 101, the Example B of the present disclosure illustrates that the RC oscillator 101 can be used in low power, low frequency designs too. In this case, the area, accuracy and FOM are still very good compared to the other examples, in spite of the low frequency and low current shown.

The Examples A and B of the present disclosure also illustrate that the frequency of the RC oscillator 101 is widely programmable by changing the resistance of the resistor 108. Both Examples A and B use the same capacitance for the capacitor 109, but have over a thousand-fold difference in frequency.

Some example circuits for generating the supply voltage Vdd_local are shown in FIGS. 4-9 in accordance with various embodiments of the present disclosure. In general, each of these examples uses PMOS and NMOS transistors to form an inverter in much the same way as that of the inverters 103-105 of the inversion ring (FIG. 1). Each circuit, therefore, uses the Vtp (threshold voltage of the PMOS transistor) and the Vtn (threshold voltage of the NMOS transistor) of the inverter to generate a reference voltage that is based on the sum of the two threshold voltages and with which the supply voltage Vdd_local is generated.

Figure 4:
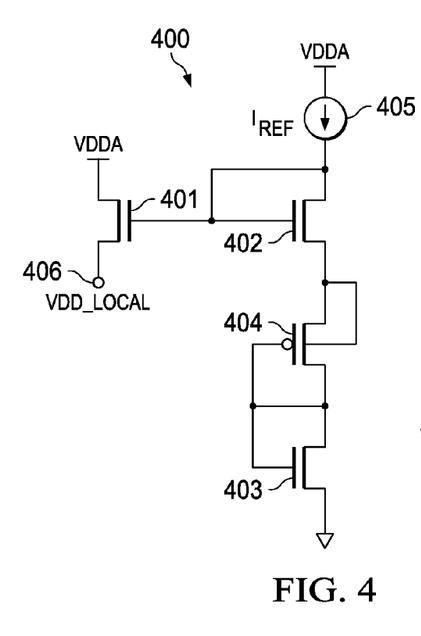
FIGS. 4-9 are simplified schematic diagrams of example circuits for generating a supply voltage for the RC oscillator shown in FIG. 1 in accordance with embodiments of the present disclosure.

A simplified first example circuit 400 for generating the supply voltage Vdd_local is shown in FIG. 4 in accordance with some embodiments of the present disclosure. The example circuit 400 generally includes NMOS transistors 401, 402 and 403, a PMOS transistor 404, a current source 405 and an output node 406 connected as shown. The bottom NMOS transistor 403 and the PMOS transistor 404 serve as the self-biased inverter. The top two NMOS transistors 401 and 402 form a current mirror powered by the current source 405 and an appropriate available supply voltage Vdda. The voltage level between the transistors 402 and 404 is generally determined by the threshold voltages of the transistors 403 and 404. As a result of the current mirroring, therefore, the voltage level at the output node 406 is related to the voltage level between the transistors 402 and 404, depending on the relative properties of the transistors 401 and 402. The voltage level at the output node 406 is provided as the supply voltage Vdd_local.

Figure 5:
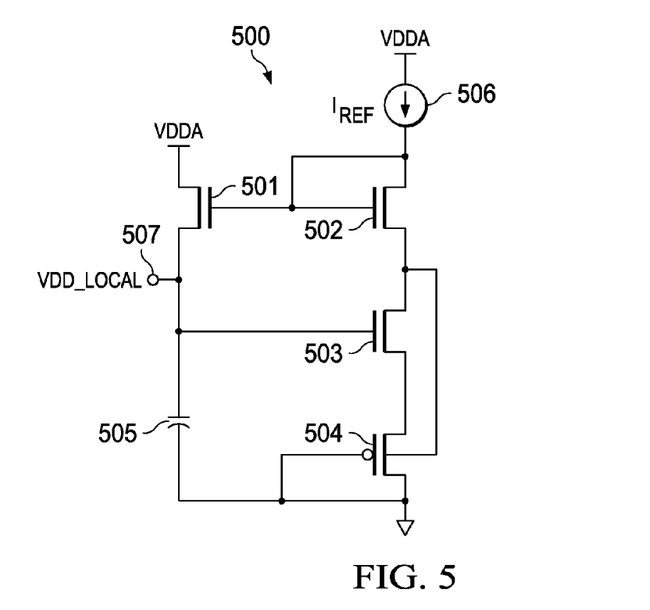

A simplified second example circuit 500 for generating the supply voltage Vdd_local is shown in FIG. 5 in accordance with some embodiments of the present disclosure. The example circuit 500 generally includes NMOS transistors 501, 502 and 503, a PMOS transistor 504, a capacitor 505, a current source 506 and an output node 507 connected as shown. The NMOS transistor 503 and the PMOS transistor 504 (with positions reversed from those of transistors 403 and 404) serve as the self-biased inverter. The top two NMOS transistors 501 and 502 form a current mirror powered by the current source 506 and an appropriate available supply voltage Vdda. The voltage level between the transistors 502 and 503 is generally determined by the threshold voltages of the transistors 503 and 504. As a result of the current mirroring, therefore, the voltage level at the output node 507 is related to the voltage level between the transistors 502 and 503, depending on the relative properties of the transistors 501 and 502. The voltage level at the output node 507 is provided as the supply voltage Vdd_local. This configuration generally, but not exclusively, applies to relatively low frequency versions of the RC oscillator 101.

Figure 6:
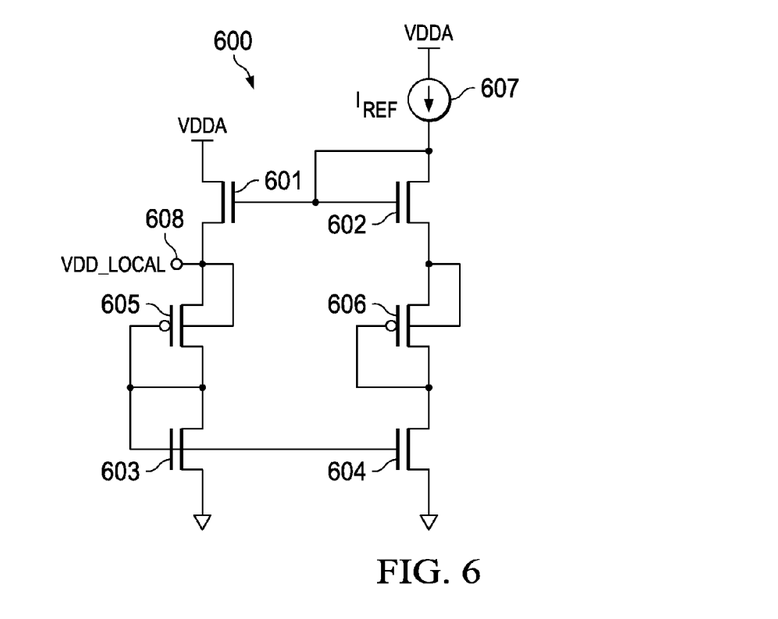

A simplified third example circuit 600 for generating the supply voltage Vdd_local is shown in FIG. 6 in accordance with some embodiments of the present disclosure. The example circuit 600 generally includes NMOS transistors 601-604, PMOS transistors 605 and 606, a current source 607 and an output node 608 connected as shown. The NMOS transistor 604 and the PMOS transistor 606 serve as the self-biased inverter. The top two NMOS transistors 601 and 602 form a current mirror powered by the current source 607 and an appropriate available supply voltage Vdda. The voltage level between the transistors 602 and 606 is generally determined by the threshold voltages of the transistors 604 and 606. Additionally, the NMOS transistor 603 and the PMOS transistor 605 serve as a duplicate of the self-biased inverter (604 and 606) to enable a feedback loop. As a result of this configuration, the voltage level at the output node 608 is related to the voltage level between the transistors 602 and 606 (depending on the relative properties of the transistors 601 and 602). The feedback enables closer matching of the voltage level at the output node 608 than is generally achievable with the configuration in FIG. 4, but at the cost of slightly higher power consumption. The voltage level at the output node 608 is provided as the supply voltage Vdd_local.

Figure 7:
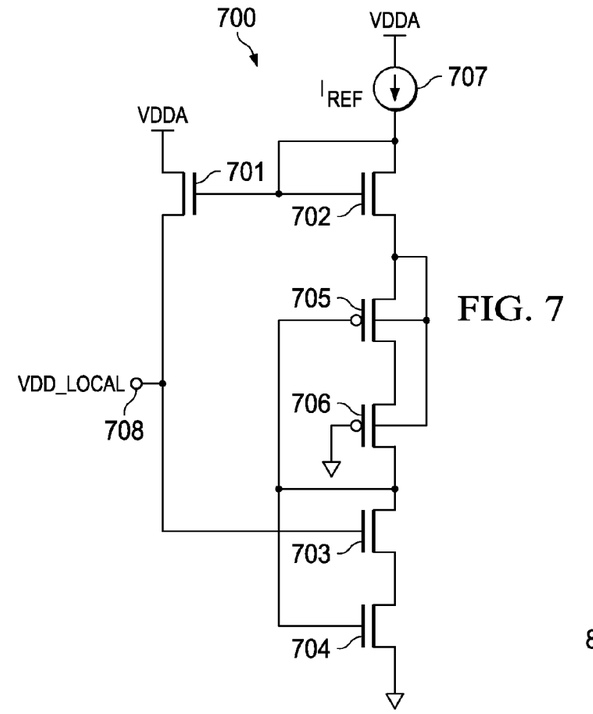

A simplified fourth example circuit 700 for generating the supply voltage Vdd_local is shown in FIG. 7 in accordance with some embodiments of the present disclosure. The example circuit 700 generally includes NMOS transistors 701-704, PMOS transistors 705 and 706, a current source 707 and an output node 708 connected as shown. In this case, the transistors 703-706 that serve as the self-biased inverter are cascoded, so the impact of voltage variation matters less than in some of the previous examples. The example circuit 700 also has some feedback through the NMOS cascode transistor 703. The top two NMOS transistors 701 and 702 form a current mirror powered by the current source 707 and an appropriate available supply voltage Vdda. The voltage level between the transistors 702 and 705 is generally determined by the threshold voltages of the transistors 703-706. As a result of the current mirroring, therefore, the voltage level at the output node 708 is related to the voltage level between the transistors 702 and 705, depending on the relative properties of the transistors 701 and 702. The voltage level at the output node 708 is provided as the supply voltage Vdd_local.

Figure 8:
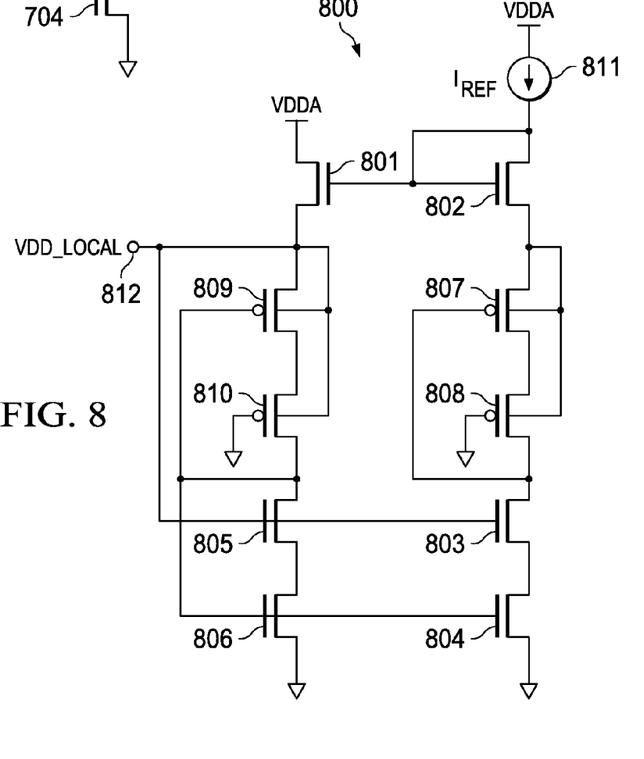

A simplified fifth example circuit 800 for generating the supply voltage Vdd_local is shown in FIG. 8 in accordance with some embodiments of the present disclosure. The example circuit 800 generally includes NMOS transistors 801-806, PMOS transistors 807 and 810, a current source 811 and an output node 812 connected as shown. The NMOS transistors 803 and 804 and the PMOS transistors 807 and 808 serve as the self-biased inverter with cascoding. The top two NMOS transistors 801 and 802 form a current mirror powered by the current source 811 and an appropriate available supply voltage Vdda. The voltage level between the transistors 802 and 807 is generally determined by the threshold voltages of the transistors 803, 804, 807 and 808. Additionally, the NMOS transistors 805 and 806 and the PMOS transistors 809 and 810 serve as a duplicate of the cascoded self-biased inverter (803, 804, 807 and 808) to enable a feedback loop. As a result of this configuration, the voltage level at the output node 812 is related to the voltage level between the transistors 802 and 807, depending on the relative properties of the transistors 801 and 802. The feedback and cascoding enable closer matching of the voltage level at the output node 812 than is generally achievable with some of the other configurations shown herein. The voltage level at the output node 812 is provided as the supply voltage Vdd_local.

Figure 9:
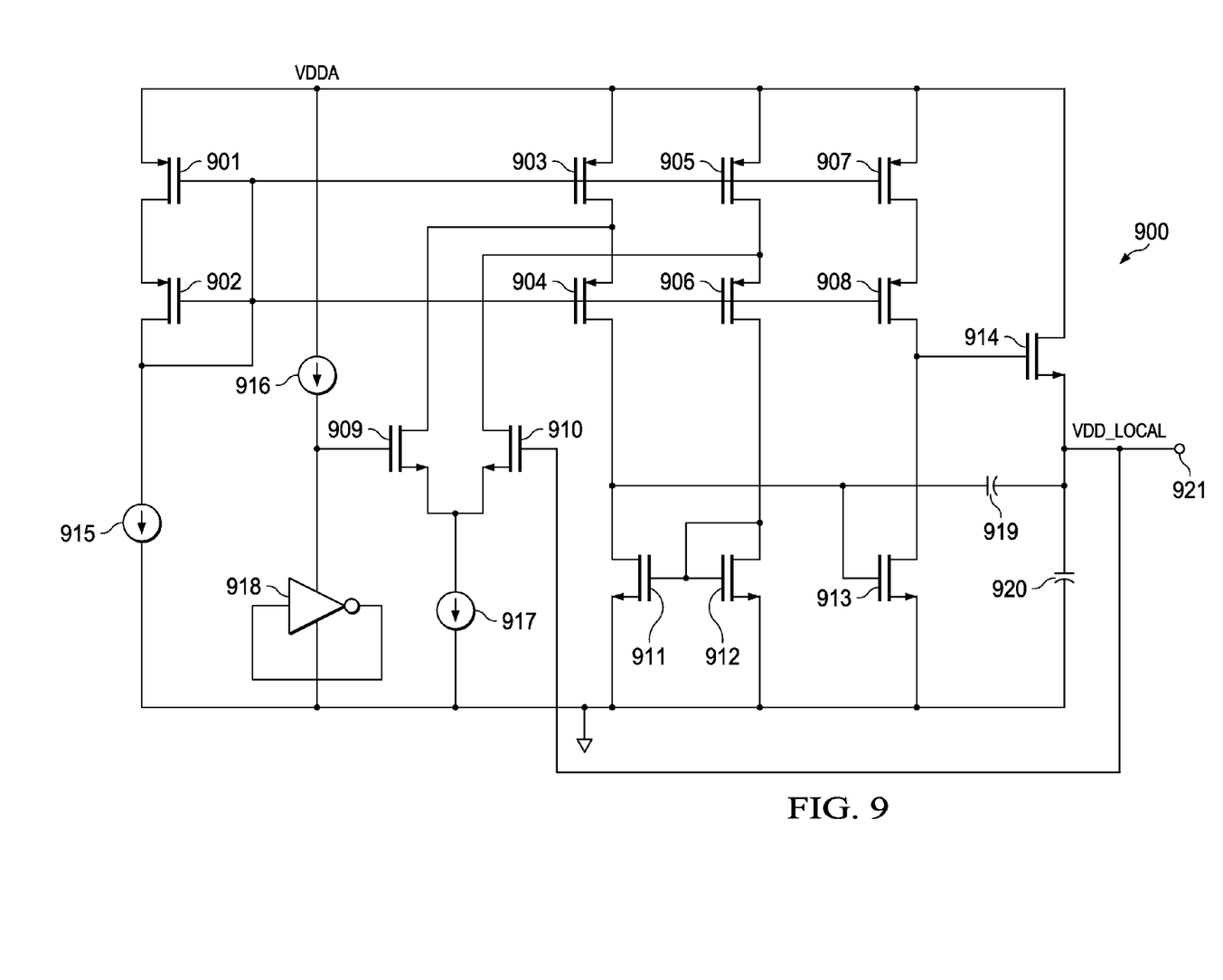

A simplified sixth example circuit 900 for generating the supply voltage Vdd_local is shown in FIG. 9 in accordance with some embodiments of the present disclosure. The example circuit 900 generally includes PMOS transistors 901-908, NMOS transistors 909-914, current sources 915-917, an inverter 918, capacitors 919 and 920 and an output node 921 connected as shown. The inverter 918 is the self-biased inverter that replicates the function of the inverters 103-106 of the inverter ring (FIG. 1) and is driven by the current source 916. In this manner, a reference voltage is generated between the inverter 918 and the current source 916. The reference voltage is provided to the NMOS transistor 909. Transistors 903, 904, 905, 906, 911, 912 form an error amplifier along with NMOS transistors 909 and 910. The error amplifier produces an output voltage for the output node 921 that is based on the reference voltage. A level shift is performed on the output voltage, wherein the NMOS transistor 913 steps it up and the NMOS transistor 914 steps it back down again. The capacitor 919 allows high frequency signals in the output voltage (e.g. due to the switching of the inverters 103-106) to bypass the error amp and get re-injected into 913, which provides a sort of high-speed compensation. The capacitor 920 is a decoupling capacitor for enhancing the output voltage stability. The net result is that the output voltage at the output node 921 is provided as the supply voltage Vdd_local.

In addition to improved accuracy, the present invention disclosure enables improvements in phase noise or jitter of the RC oscillator 101. In some simulations, the RC oscillator 101 has been shown to have about 10 dB better phase noise or jitter than comparable prior art oscillators. At least a portion of this improvement may be due to the fact that the RC oscillator 101 does not require current sources to provide current to the resistor 108 or the capacitor 109 or a comparator to determine when to change the state of the clock signal, as is common in prior art RC oscillators. Such current sources can cause frequency variations with supply voltage changes, and the bandwidth and power consumption of the comparator can further limit the frequency accuracy. By removing the common current sources and comparators used in prior art RC oscillators, phase noise or jitter is substantially improved for the RC oscillator 101.

Presently preferred embodiments of the present disclosure and its improvements have been described with a degree of particularity. This description has been made by way of preferred example. It should be understood, however, that the scope of the claimed subject matter is defined by the following claims, and should not be unnecessarily limited by the detailed description of the preferred embodiments set forth above.

The invention claimed is:

1. A local power supply circuit comprising:
a supply voltage input and a supply voltage return lead;

a current source having an input coupled to the supply voltage input and an output;

a current mirror having a first input coupled to the supply voltage input, a second input coupled to the output of the current source, a first output, and a local power supply output; and a first self-biased inverter having a third input coupled to the first output and an output coupled to the supply voltage return lead, the first self-biased inverter including a third transistor having a control node, a first node, and a second node and a fourth transistor having a control node, a first node, and a second node, the first and second nodes of the third and fourth transistors being coupled in series between the third input and the supply voltage return lead, the control node of the third transistor being connected to the local power supply output, and the control node of the fourth transistor being connected to the supply voltage return lead, and including a capacitor coupled between the local power supply output and the supply voltage return lead.

2. The local power supply circuit of claim 1 in which the current mirror includes a first transistor having a control node coupled to the second input, and having two other nodes coupled between the second input and the first output, and a second transistor having a control node coupled to the second input and two other nodes coupled between the first input and the local power supply output.

3. The local power supply circuit of claim 2 in which the first and second transistors are NMOS transistors.

4. A local power supply circuit comprising:

a supply voltage input and a supply voltage return lead;

a current source having an input coupled to the supply voltage input and an output;

a current mirror having a first input coupled to the supply voltage input, a second input coupled to the output of the current source, a first output, and a local power supply output;

a first self-biased inverter having a third input coupled to the first output and an output coupled to the supply voltage return lead, the first self-biased inverter including third and fourth transistors coupled between the third input and the supply voltage return lead, and a control node of the third transistor coupled to a node between the third and fourth transistors; and a second self-biased inverter coupled between the local power supply output and the supply voltage return lead, the second self-biased inverter includes fifth and sixth transistors coupled between the local power supply output and the supply voltage return lead, and a control node of each of the fifth and sixth transistors coupled together and to a node between the fifth and sixth transistors and to a control node of the fourth transistor.

5. The local power supply circuit of claim 4 in which the third and fifth transistors are PMOS transistors and the fourth and sixth transistors are NMOS transistors.

6. The local power supply circuit of claim 4 in which the current mirror includes a first transistor having a control node coupled to the second input, and having two other nodes coupled between the second input and the first output, and a second transistor having a control node coupled to the second input and two other nodes coupled between the first input and the local power supply output.

\* \* \* \* \*